(12) United States Patent
Kim et al.

(10) Patent No.: US 9,607,979 B2
(45) Date of Patent: Mar. 28, 2017

(54) LIQUID CRYSTAL DISPLAY DEVICE AND MANUFACTURING METHOD THEREOF

(71) Applicant: LG Display Co., Ltd., Seoul (KR)

(72) Inventors: Seongsu Kim, Jeollabuk-do (KR); YoungJoo Kim, Goyang-si (KR); Mihee Shin, Goyang-si (KR); Mingyeong Kim, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/853,801

(22) Filed: Sep. 14, 2015

(65) Prior Publication Data

US 2016/0155736 A1 Jun. 2, 2016

(30) Foreign Application Priority Data

Nov. 27, 2014 (KR) .......................... 10-2014-0167353

(51) Int. Cl.
| | | |
|---|---|---|
| *H01L 27/02* | (2006.01) | |
| *G02F 1/1345* | (2006.01) | |
| *G02F 1/1362* | (2006.01) | |
| *H01L 29/786* | (2006.01) | |
| *G02F 1/1368* | (2006.01) | |
| *H01L 27/12* | (2006.01) | |

(52) U.S. Cl.
CPC ........ *H01L 27/0266* (2013.01); *G02F 1/1345* (2013.01); *G02F 1/1368* (2013.01); *G02F 1/136204* (2013.01); *H01L 27/124* (2013.01); *H01L 27/1225* (2013.01); *H01L 27/1259* (2013.01); *H01L 29/7869* (2013.01); *H01L 29/78603* (2013.01); *G02F 2001/136231* (2013.01); *G02F 2202/10* (2013.01); *G02F 2202/22* (2013.01)

(58) Field of Classification Search
CPC ....................... H01L 27/0266; H01L 27/1225
See application file for complete search history.

(56) References Cited

U.S. PATENT DOCUMENTS

| | | |
|---|---|---|
| 6,392,622 B1 | 5/2002 | Ozawa |
| 2013/0248869 A1 | 9/2013 | Chang et al. |
| 2014/0034947 A1 | 2/2014 | Moriguchi et al. |
| 2014/0151682 A1 | 6/2014 | Saito et al. |
| 2015/0044789 A1 | 2/2015 | Yamada et al. |

FOREIGN PATENT DOCUMENTS

WO   WO 2013/011911 A1   2/2015

OTHER PUBLICATIONS

Extended European Search Report for European patent application No. 15 186 697.7, Mar. 22, 2016, 12 pages.

*Primary Examiner* — Tran Tran
(74) *Attorney, Agent, or Firm* — Fenwick & West LLP

(57) ABSTRACT

Provided is a liquid crystal display device according to an embodiment of the present disclosure. The display device includes: a first metal layer, a first insulating layer, a second metal layer, a second insulating layer, and a third metal layer deposited in sequence on a substrate. The first insulating layer and the second insulating layer include a one-hole bridge contact portion for exposing a part of the first metal layer and a part of the second metal layer at one time. The third metal layer is realized to be in contact with the first metal layer and the second metal layer through the one-hole bridge contact portion.

22 Claims, 10 Drawing Sheets

LIQUID CRYSTAL DISPLAY DEVICE AND MANUFACTURING METHOD THEREOF

CROSS-REFERENCE TO RELATED APPLICATIONS

This application claims the priority under 35 U.S.C. 119(a) of Korean Patent Application No. 10-2014-0167353 filed on Nov. 27, 2014, which is hereby incorporated by reference in its entirety.

BACKGROUND

Technical Field

The present disclosure relates to a liquid crystal display device and a manufacturing method thereof, and more particularly, to minimizing a bezel area of a liquid crystal display device by reducing the number of contact holes in an electrostatic discharge protection circuit using an oxide semiconductor and a manufacturing method thereof.

Description of the Related Art

A liquid crystal display (LCD) device refers to a display device including a LCD panel in which a liquid crystal layer is provided. The LCD device is driven by adjusting a transmittance of the LCD panel with respect to light from a light source such as a backlight unit. Demand for a LCD device with a higher resolution and low power consumption, and a minimized bezel with small thickness has recently increased.

Thin film transistors in a LCD device are classified into thin film transistors using amorphous-silicon, thin film transistors using poly-silicon or Low Temperature Polycrystalline Silicon (LTPS), and thin film transistors using an oxide semiconductor, depending on a material used for an active layer of the thin film transistor.

Thin film transistors using an oxide semiconductor have high electron mobility and remarkably low leakage current, as compared with thin film transistors using amorphous-silicon. Thin film transistors using an oxide semiconductor also are highly reliable, as compared with thin film transistors using amorphous-silicon. Thus, a liquid crystal display device using an oxide semiconductor has been actively studied.

SUMMARY

The characteristics, particularly high electron mobility, of an oxide semiconductor may cause an increase in a bezel area. Specifically, an electrostatic discharge (ESD) protection circuit is disposed in a bezel area of a liquid crystal display (LCD) device. If an oxide semiconductor is used for a thin film transistor constituting the ESD protection circuit, when static electricity is introduced from the outside, a current flowing in the ESD protection circuit increases due to high electron mobility of the oxide semiconductor and thus, power consumption increases. In order to suppress the increase in power consumption of the ESD protection circuit using the oxide semiconductor, it is desired to design the thin film transistor to have a channel longer than the channel of the thin film transistor using different semiconductor materials. A thin film transistor using an oxide semiconductor material increases a size of an ESD protection circuit area when compared with the case of a thin film transistor using different semiconductor materials. Thus, a size of the bezel area in the LCD device is increased.

A lot of studies on reducing manufacturing cost of a LCD device have been conducted. Attempts have been made to reduce a mask of a LCD device in order to reduce the manufacturing cost of the LCD device.

A LCD device includes a plurality of layers including conductive layers and insulating layers. The conductive layers are electrically connected with each other through contact holes formed in the insulating layers. If the number of masks used in manufacturing the LCD device is reduced, contact holes may not be formed at desired positions. In order to compensate for this reduction, the number of the contact holes may be increased and the conductive layers may be connected with each other through a bridge structure connecting the contact holes. For example, a conductive layer 'A' and a conductive layer 'B' can be connected with each other. If a contact hole for a direct contact between the conductive layer 'A' and the conductive layer 'B' cannot be formed due to reduction in masks, a bridge structure may be used. This bridge structure is configured to connect a contact hole exposing the conductive layer 'A' and a contact hole exposing the conductive layer 'B' with a conductive layer 'C'. However, if such a bridge structure is used, the number of contact holes is increased and an area between a plurality of contact holes needs to be secured. Accordingly, a bezel area in the LCD device is further increased.

Since the above-described ESD protection circuit is realized by using a plurality of thin film transistors in which a source electrode or a drain electrode is connected with a gate electrode, a contact hole for electrically connecting the gate electrode with the source electrode or the drain electrode is desired. However, if the number of masks used in manufacturing the LCD device is reduced, a contact hole for direct contact between the gate electrode and the source electrode or the drain electrode cannot be formed. Therefore, a bridge structure occupying a greater area is desired.

If the ESD protection circuit is realized by employing a thin film transistor using an oxide semiconductor, a bezel is inevitably increased due to a channel. Since the bridge structure is employed due to a reduction in number of masks to be used, a size of a bezel area is further increased.

Therefore, it is difficult to realize a LCD device having a thin bezel area if a thin film transistor using an oxide semiconductor is employed and the number of masks is reduced in order to reduce manufacturing cost.

The present disclosure relates to a LCD device having a structure in which a size of a bezel area is not increased when the LCD device is manufactured by employing an oxide semiconductor and using the reduced number of masks.

Accordingly, the present disclosure provides a LCD device having a minimized size of a bezel area by reducing the number of contact holes for connecting conductive layers with each other even when using a reduced number of masks, and a manufacturing method thereof.

Further, the present disclosure provides a LCD device having a minimized size of an ESD protection circuit with a minimized size of a supply voltage line unit, and a manufacturing method thereof.

The present disclosure is not limited to the aforementioned, and other objects, which are not explicitly mentioned, will be apparent to a person having ordinary skill in the art from the following description.

According to an aspect of the present disclosure, there is provided a display device. The display device includes: a first metal layer, a first insulating layer, a second metal layer, a second insulating layer, and a third metal layer deposited in sequence on a substrate. The first insulating layer and the second insulating layer include a one-hole bridge contact portion exposing a part of the first metal layer and a part of the second metal layer in one hole. The third metal layer is in contact with the first metal layer and the second metal layer through the one-hole bridge contact portion.

In one embodiment, the first metal layer and the second metal layer are electrically connected through one of a first contact hole of the first insulating layer and a second contact hole of the second insulating layer. The one-hole bridge contact portion may be a structure that minimizes an increase in number of masks for forming the contact hole of the first insulating layer or the second insulating layer and minimizes an increase in design area caused by the first and second contact holes.

In one embodiment, the one-hole bridge contact portion is applied to an electrostatic discharge protection circuit. The ESD protection circuit includes a thin film transistor containing an oxide semiconductor in a bezel area of the display device.

In one embodiment, by applying the structure of the one-hole bridge contact portion, a size of the electrostatic discharge protection circuit can be realized not to be greater than a size of an electrostatic discharge protection circuit having equivalent electrostatic discharge performance and including a thin film transistor containing amorphous-silicon.

According to another aspect of the present disclosure, there is provided a liquid crystal display device. The liquid crystal display device includes: a substrate, a first metal layer, a second metal layer, a first insulating layer, a second insulating layer, and a conductive layer. The substrate includes an active area and a bezel area surrounding the active area. The first metal layer is in the bezel area on the substrate. The first insulating layer is disposed on the first metal layer and includes a first opening exposing a part of a top side of the first metal layer. The second metal layer is overlapped with the first metal layer. The second insulating layer is disposed on the second metal layer, and includes a second opening exposing the part of the top side of the first metal layer and a part of a top side of the second metal layer. The conductive layer is in contact with the part of the top side of the first metal layer and the part of the top side of the second metal layer within the second opening in the second insulating layer. Since the first metal layer and the second metal layer are electrically connected within the second opening of the second insulating layer, in a liquid crystal display device manufactured with a minimized number of masks, the number of holes in a planarization layer can be reduced and a size of a circuit area can be reduced. Therefore, the liquid crystal display device having a thinner bezel area can be provided.

In one embodiment, the liquid crystal display device further includes: a thin film transistor including an active layer containing an oxide semiconductor, a gate electrode, a source electrode, and a drain electrode on the substrate. The first metal layer is on a same level as the gate electrode and the second metal layer is on a same level as the source electrode and the drain electrode. The first insulating layer is a gate insulating layer on the gate electrode and the second insulating layer is a planarization layer configured to flatten an upper part of the thin film transistor.

In one embodiment, the liquid crystal display device further includes an electrostatic discharge protection circuit in the bezel area, and the electrostatic discharge protection circuit includes the thin film transistor.

In one embodiment, the first metal layer is extended from the gate electrode and the second metal layer is extended from one of the source electrode and the drain electrode.

In one embodiment, the liquid crystal display device further includes: a first line on a same level as the second metal layer, a second line on a same level as the second metal layer and at least in part parallel to the first line, and a third line on the same level as the first metal layer and intersecting with the first line and the second line. The electrostatic discharge protection circuit is between the first line and the second line, and the thin film transistor is at a portion where the first line and the second line intersect with the third line.

In one embodiment, the first metal layer is connected with the gate electrode and the third line, and the second metal layer is connected with one of the source electrode and the drain electrode.

In one embodiment, the liquid crystal display device further includes a driving thin film transistor disposed in the active area. The driving thin film transistor is configured to drive a pixel, and includes an active layer containing an oxide semiconductor. A channel length of the active layer in the thin film transistor is longer than a channel length of the active layer in the driving thin film transistor.

In one embodiment, the liquid crystal display device further includes a supply voltage line unit disposed in the bezel area. The supply voltage line unit includes the first metal layer, the second metal layer, and the conductive layer.

In one embodiment, the active layer of the thin film transistor is in contact with a bottom side of the second metal layer.

In one embodiment, the conductive layer is in contact with a lateral side of the active layer.

In one embodiment, the conductive layer is in contact with the first metal layer, the gate insulating layer, the active layer, and the second metal layer within the first opening and the second opening.

In one embodiment, the liquid crystal display device further includes a passivation layer on the source electrode and the drain electrode. The passivation layer is in contact with the active layer between the source electrode and the drain electrode.

According to yet another aspect of the present disclosure, there is provided a manufacturing method of a liquid crystal display device. The liquid crystal display device includes a thin film transistor including a gate electrode, a source electrode, and a drain electrode. the manufacturing method includes: forming a first metal layer on a same level as the gate electrode on a substrate, forming a gate insulating layer on the gate electrode and the first metal layer, forming a second metal layer overlapping in part with the first metal layer on a same level as the source electrode and the drain electrode; forming a passivation layer covering the second metal layer, forming a planarization layer on the passivation layer, removing a part of the planarization layer forming a contact hole exposing the passivation layer on the first metal layer and the second metal layer, removing the gate insulating layer and the passivation layer within the contact hole of the planarization layer exposing a top side of the first metal layer and a top side of the second metal layer, and forming a conductive layer over the top side of the first metal layer and the top side of the second metal layer within the contact hole electrically connecting the first metal layer with the second metal layer. The liquid crystal display device is manufactured with a minimized number of masks and also, the first metal layer and the second metal layer are electrically connected by the conductive layer within a single hole of the planarization layer. Thus, it is possible to reduce a size of a circuit area by reducing the number of holes in the planarization layer. Therefore, the liquid crystal display device having a thinner bezel area can be provided by using a minimized number of masks.

In one embodiment, the manufacturing method of a liquid crystal display device further includes forming an active layer containing an oxide semiconductor on the gate insulating layer before forming the second metal layer. The passivation layer is in contact with the active layer between the source electrode and the drain electrode.

Details of other embodiments will be included in the detailed description of the disclosure and the accompanying drawings.

According to the present disclosure, in a structure of a liquid crystal display device with a reduced number of masks used in manufacturing the liquid crystal display device, a first metal layer and a second metal layer are electrically connected through a particular bridge structure using a single contact hole, so that it is not necessary to secure an area between contact holes required for applying a bridge structure using two contact holes. Therefore, in the present disclosure, a size of a circuit part such as an electrostatic discharge protection circuit is reduced, so that a size of a bezel area of the liquid crystal display device can be reduced.

Further, it is possible to provide a liquid crystal display device of which a bezel area is not increased even if a channel length of an electrostatic discharge protection circuit is increased in the liquid crystal display device using an oxide semiconductor.

Furthermore, it is possible to provide a liquid crystal display device of which a bezel area is minimized by reducing a size of a contact hole in a supply voltage line unit and thus reducing a size of the bezel area of the liquid crystal display device.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE PREFERRED EMBODIMENT

Figure 1:
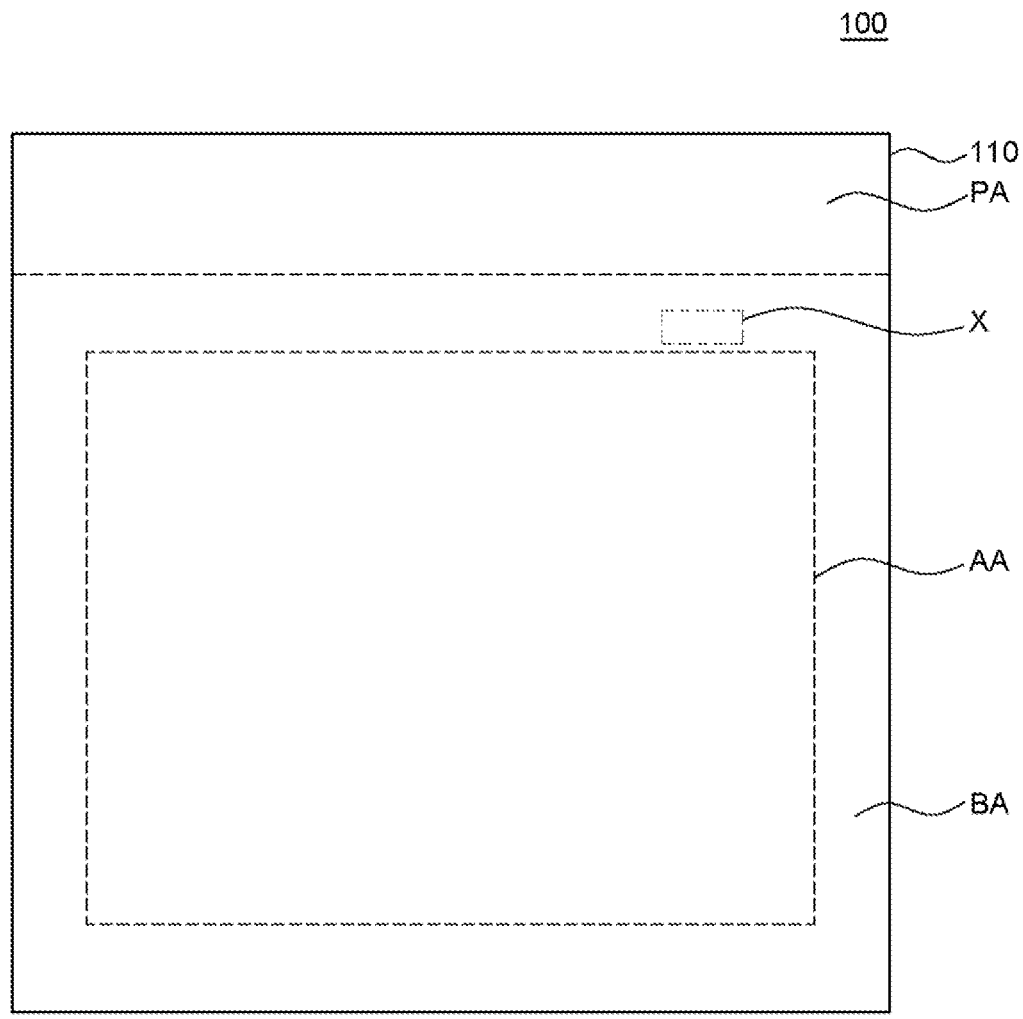
FIG. 1 is a schematic plan view of a liquid crystal display (LCD) device, according to one embodiment of the present disclosure.

Advantages and features of the present disclosure, and methods for accomplishing the same will be more clearly understood from embodiments described below with reference to the accompanying figures. However, the present disclosure is not limited to the following embodiments but may be implemented in various different forms. The embodiments are provided to complete disclosure of the present disclosure. The present disclosure will be defined by the appended claims.

The shapes, sizes, ratios, angles, numbers, and the like shown in the accompanying drawings for describing embodiments of the present disclosure are merely examples, and the present disclosure is not limited thereto. Like reference numerals generally denote like elements throughout the present specification and accompanying figures. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", "next," and the like, one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various embodiments of the present disclosure will be described in detail with reference to the accompanying drawings.

Figure 2:
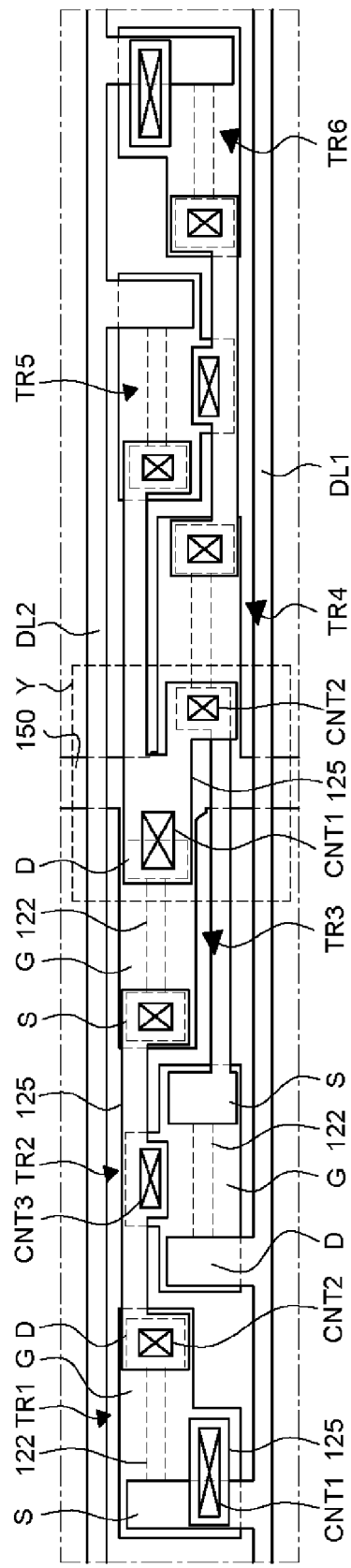
FIG. 2 is a schematic plan view of an area 'X' of FIG. 1 in the LCD device, according to one embodiment of the present disclosure.
Figure 3:
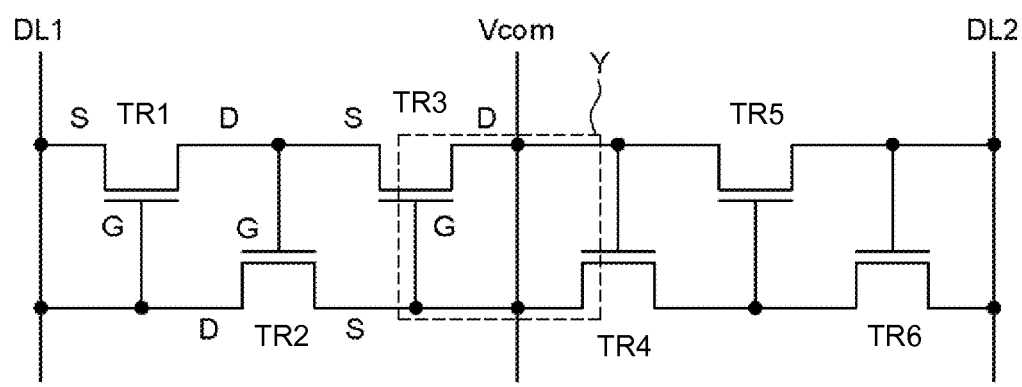
FIG. 3 is a schematic circuit diagram of an electrostatic discharge (ESD) protection circuit in the LCD device, according to one embodiment of the present disclosure.

FIG. 1 is a schematic plan view of a liquid crystal display (LCD) device, according to one embodiment of the present disclosure. FIG. 2 is a schematic plan view of an area X of FIG. 1 in the LCD device, according to one embodiment of the present disclosure. FIG. 3 is a schematic circuit diagram of an electrostatic discharge (ESD) protection circuit in the LCD device, according to one embodiment of the present disclosure. For convenience in explanation, FIG. 2 illustrates only conductive or semiconductor layers. Referring to FIG. 1 and FIG. 2, a liquid crystal display (LCD) device 100 includes a substrate 110, a first data line 'DL1', a second data line 'DL2', a supply voltage line 150, thin film transistors TR1 to TR6 and source 'S', drain 'D', and gate 'G' electrodes thereof, and a conductive layer 125. The thin film transistors TR1 to TR6 in FIG. 2 correspond to thin film transistors TR1 to TR6 illustrated in the circuit diagram of FIG. 3.

The substrate 110 supports various elements formed on the substrate 110. Referring to FIG. 1, the substrate 110 includes an active area 'AA', a bezel area 'BA', and a pad area 'PA'. In the active area 'AA', a liquid crystal layer and components for controlling the liquid crystal layer are disposed. The bezel area 'BA' refers to an area configured to surround the active area 'AA' and in which a line unit and various circuits are disposed. The pad area 'PA' refers to an area disposed on one side of the substrate 110 and in which a pad part connected with the flexible printed circuit substrate 110 is disposed. In the area 'X' of FIG. 1, a plurality of data lines extended from the pad area 'PA' to the active area 'AA' and an electrostatic discharge (ESD) protection circuit connected with the data lines is disposed. However, the present disclosure is not limited thereto, and the ESD protection circuit may be connected with gate lines. The ESD protection circuit is configured to suppress applied static electricity from being applied to the active area 'AA'. Thus, the ESD protection circuit protects components within the active area 'AA', and may include a plurality of thin film transistors TR1 to TR6. The thin film transistors TR1 to TR6 are located in a bezel area BA of the display device 100.

The plurality of thin film transistors TR1 to TR6 includes an active layer 122, a gate electrode 'G', a source electrode 'S', and a drain electrode 'D'. The active layer 122 may be formed using an oxide semiconductor. In one area, the active layer 122 forms a channel between the source electrode 'S' and the drain electrode 'D', and in another area, the active layer 122 is formed to be overlapped with the source electrode 'S' and the drain electrode 'D'. A channel length of the thin film transistors TR1 to TR6 in the ESD protection circuit is longer than a channel length of a driving thin film transistor in the active area 'AA' to more easily emit static electricity. Further, the oxide semiconductor has exceptionally higher electron mobility than other silicon semiconductors, and, thus, a current flowing in the ESD protection circuit increases. Thus, power consumption in the ESD protection circuit increases. In order to suppress the increase in power consumption, it is desired to form a longer channel than the case of using another silicon semiconductor. If the ESD protection circuit is configured by using the thin film transistors TR1 to TR6 each using the oxide semiconductor as the active layer 122, a size of the ESD protection circuit may be increased corresponding to an increase of the channel length. In order to reduce the size of the ESD protection circuit, it is desired to reduce sizes of the other components except for the active layer 122. It is possible to reduce the size of the ESD protection circuit in the LCD device 100 by minimizing the number of contact holes and minimizing the size of the bezel area 'BA'. Hereinafter, referring to FIG. 2 and FIG. 3, the components of the LCD device 100 and a connection relationship through a first contact hole 'CNT1' will be described.

Referring to FIG. 2, the first data line 'DL1' and the second data line 'DL2' at least in part parallel to the first data line 'DL1' are disposed. The first data line 'DL1' and the second data line 'DL2' extend toward the thin film transistors TR1, TR2, TR5, and TR6 to form electrodes of the thin film transistors TR1, TR2, TR5, and TR6. The supply voltage line 150 is disposed to intersect with the first data line 'DL1' and the second data line 'DL2', and may be, for example, a Vcom line. The ESD protection circuit, configured by using the thin film transistors TR1 to TR6, is disposed between the first data line 'DL1' and the second data line 'DL2'.

Referring to FIG. 3, the source electrode 'S' of the first thin film transistor TR1, the drain electrode 'D' of the second thin film transistor TR2, and the first data line DL1 are connected with the gate electrode 'G' of the first thin film transistor TR1. In FIG. 2, the source electrode 'S' of the first thin film transistor TR1, the drain electrode 'D' of the second thin film transistor TR2, and the first data line 'DL1' are disposed on the same level. However, they are disposed on a different level from the gate electrode 'G' of the first thin film transistor TR1, and are electrically connected with each other through the first contact hole 'CNT1'.

The first contact hole 'CNT1' is a contact hole passing through the conductive layer 125 and connecting a metal layer on a level of the gate electrode 'G' with a metal layer on a level of the source electrode 'S' of the first thin film transistor TR1 or the drain electrode 'D' of the second thin film transistor TR2. The gate electrode 'G' of the first thin film transistor TR1 and the source electrode 'S' of the first thin film transistor TR1 are connected with each other through the first contact hole 'CNT1' overlapping with each other. Since the gate electrode 'G' of the first thin film transistor TR1 the source electrode 'S' of the first thin film transistor TR1 are connected with each other as being overlapped with each other, a size of the first contact hole 'CNT1' may be minimized. The conductive layer 125 is disposed on the same level as a pixel electrode of the LCD device 100, but is not limited thereto, and may be disposed on the same level as a common electrode depending on a structure of the LCD device 100.

Likewise, if a metal layer on a level of the gate level 'G' of the second thin film transistor TR2 and a metal layer on a level of the source electrode 'S' of the third thin film transistor TR3 or the drain electrode 'D' of the first thin film transistor TR1 are not overlapped with each other, a bridge structure passing through a second contact hole 'CNT2' and a third contact hole 'CNT3' is employed. The second contact hole 'CNT2' is configured to expose a part of a top side of the source electrode 'S' of the third thin film transistor TR3 or drain electrode 'D' of the first thin film transistor TR1, and the third contact hole 'CNT3' is configured to expose a part of a top side of the gate electrode 'G' of the second thin film transistor TR2. The conductive layer 125 electrically connects the drain electrode 'D' of the first thin film transistor TR1 exposed through the second contact hole 'CNT2' with the gate electrode 'G' of the second thin film transistor TR2 exposed through the third contact hole 'CNT3'. FIG. 3 illustrates a configuration in which the gate electrode 'G' of the second thin film transistor TR2 is connected with the source electrode 'S' of the third thin film transistor TR3 and the drain electrode 'D' of the first thin film transistor TR1 through the second contact hole 'CNT2' and the third contact hole 'CNT3', but the present disclosure is not limited thereto. A metal layer on the same level as the gate electrode 'G' of the second thin film transistor TR2 and a metal layer on the same level as the source electrode 'S' of the third thin film transistor TR3 and the drain electrode 'D' of the first thin film transistor TR1 may be connected with each other through the first contact hole 'CNT1'. For example, a metal layer may be extended from the drain electrode 'D' of the first thin film transistor TR1 and then overlapped with the gate electrode 'G' of the second thin film transistor TR2, and the metal layer extended from the drain electrode 'D' of the first thin film transistor TR1 may be connected with the gate electrode 'G' of the second thin film transistor TR2 through the first contact hole 'CNT1'.

Meanwhile, the third contact hole 'CNT3' and the second contact hole 'CNT2' may be formed in the gate electrode 'G' of the first thin film transistor TR1 and the source electrode 'S' of the first thin film transistor TR1, respectively. Further, the gate electrode 'G' and the source electrode 'S' may be connected with each other through the conductive layer 125. However, since a margin having more than a predetermined length is needed between the contact holes 'CNT2' and 'CNT3', the bridge structure using a plurality of contact holes 'CNT2' and 'CNT3' increases an area for forming a thin film transistor.

In particular, if the bridge structure using the two contact holes 'CNT2' and 'CNT3' is applied to the drain electrode 'D' and the gate electrodes 'G' of the third thin film transistor TR3, and to the drain electrode 'D' and the gate electrode 'G' of the fourth thin film transistor TR4, a size of the ESD protection circuit is greatly increased. Therefore, in the LCD device 100, the gate electrode 'G' is electrically connected with the source electrode 'S' or the drain electrode 'D' through the single first contact hole 'CNT1'. That is, a one-hole bridge contact portion is applied to an ESD protection circuit disposed in a bezel area 'BA' of a display device and including a thin film transistor containing an oxide semiconductor. Hereinafter, the first contact hole 'CNT1' and the one-hole bridge contact portion will be described in more detail.

Figure 4:
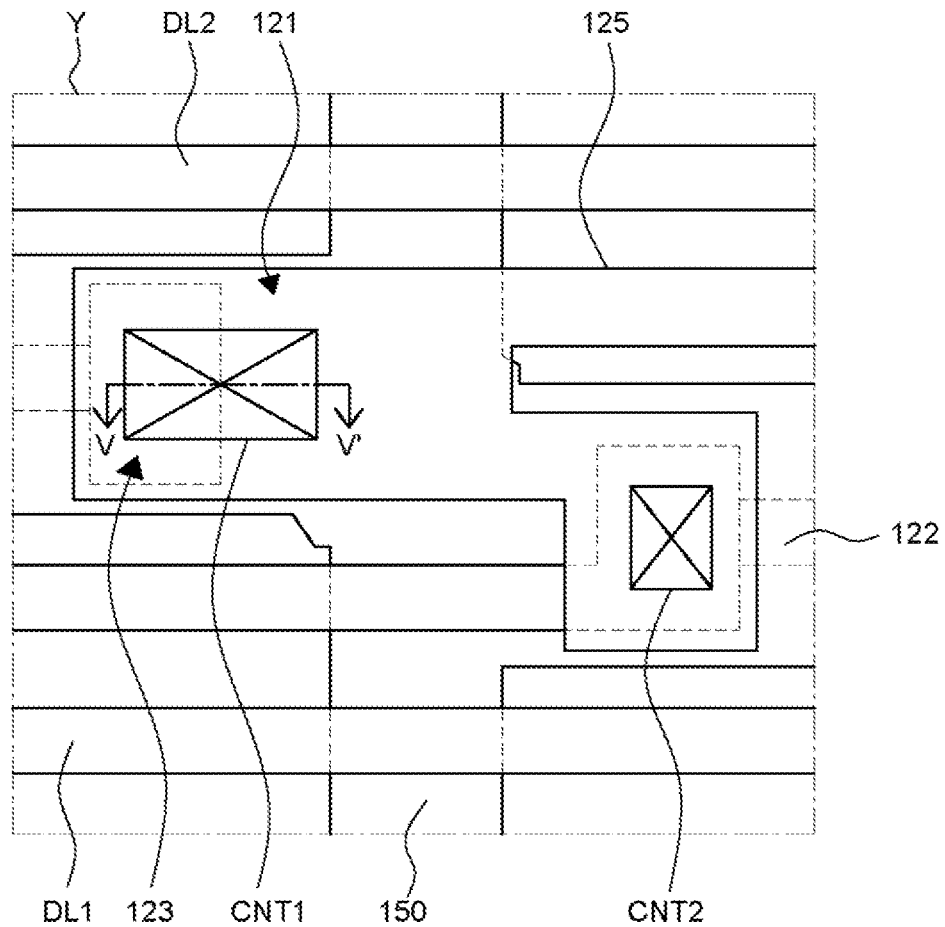
FIG. 4 is a schematic enlarged plan view of an area 'Y' of FIG. 2 and FIG. 3, according to one embodiment of the present disclosure.
Figure 5:
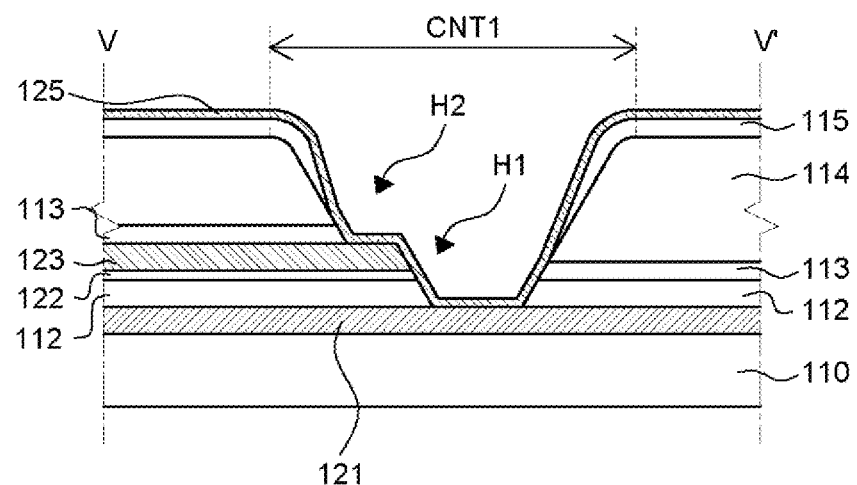
FIG. 5 is a schematic cross-sectional view of the LCD device taken along a line V-V' of FIG. 4, according to one embodiment of the present disclosure.

FIG. 4 is a schematic enlarged plan view of an area 'Y' of FIG. 2 and FIG. 3. FIG. 5 is a schematic cross-sectional view of the LCD device taken along a line V-V' of FIG. 4. At a portion where the first data line 'DL1' and the second data line 'DL2' intersect with the supply voltage line 150, the third thin film transistor TR3 and the fourth thin film transistor TR4 are disposed. The gate electrode 'G' and the drain electrode 'D' of the third thin film transistor TR3, the source electrode 'S' of the second thin film transistor TR2, and the gate electrode 'G' and the drain electrode 'D' of the fourth thin film transistor TR4 are electrically connected. A first metal layer 121 is extended from the supply voltage line 150, and a second metal layer 123 is extended from the drain electrode 'D' of the third thin film transistor TR3.

In FIG. 5, the first metal layer 121 is disposed on the substrate 110, and a gate insulating layer 112 is disposed on the first metal layer 121. The gate insulating layer 112 may also be referred to as a first insulating layer 112. The gate insulating layer 112 includes a first opening 'H1' for exposing a part of a top side of the first metal layer 121. The active layer 122 and the second metal layer 123 are disposed in sequence on the gate insulating layer 112. That is, the active layer 122 is disposed to be in contact with a bottom of the second metal layer 123.

Further, a part of the second metal layer 123 is overlapped with the first metal layer 121. A passivation layer 113 is disposed on the second metal layer 123. A planarization layer 114 is disposed on the passivation layer 113. The planarization layer 114 may also be referred to as a second insulating layer 114. A common electrode may be disposed on an upper part of the planarization layer 114. If the common electrode is disposed, the common electrode may be disposed to cover at least a channel area formed by the active layer 122 formed of the oxide semiconductor. An upper insulating layer 115 is disposed on the planarization layer 114, and the upper insulating layer 115 is formed in substantially same area as the passivation layer 113. The passivation layer 113, the planarization layer 114, and the upper insulating layer 115 include an second opening 'H2' for exposing a top side of the first metal layer 121 and a part of a top side of the second metal layer 123. That is, the first contact hole 'CNT1' has a shape in which the first opening 'H1' in the gate insulating layer 112 and the second opening 'H2' in the passivation layer 113, the planarization layer 114, and the upper insulating layer 115 are combined into one. For example, the first insulating layer 112 and the second insulating layer 114 in the first contact hole 'CNT1' and the second contact hole 'CNT2' include an one-hole bridge contact portion for exposing a part of the first metal layer 121 and a part of the second metal layer 123 at one time. The one-hole bridge contact portion is a structure configured to minimize an increase in a number of masks for forming the contact holes including the first and second openings 'H1' and 'H2' in the first insulating layer 112 and the second insulating layer 114 and an increase in design area caused by the contact holes. The conductive layer 125 may also be referred to as a third metal layer 125, and the third metal layer 125 is realized to be in contact with the first metal layer 121 and the second metal layer 123 through the one-hole bridge contact portion. The conductive layer 125 is disposed over the top side of the first metal layer 121 and the top side of the second metal layer 123 exposed within the first contact hole 'CNT1' and configured to electrically connect the top side of the first metal layer 121 with the top side of the second metal layer 123. The conductive layer 125 extends from the top side of the second metal layer 123, along lateral sides of the second metal layer 123, the active layer 122, and the gate insulating layer 112 and covers the top side of the first metal layer 121. That is, the conductive layer 125 is in direct contact with the first metal layer 121, the gate insulating layer 112, the active layer 122, and the second metal layer 123 within the first contact hole 'CNT1'. This is because the LCD device 100 uses a reduced number of masks. More details thereof will be described with reference to FIG. 7 and FIG. 8a to FIG. 8f.

In the LCD device 100, the first metal layer 121 and the second metal layer 123 are electrically connected with each other by the conductive layer 125 within the single first contact hole 'CNT1'. Thus, a size of a contact hole is reduced and a process margin between contact holes is not needed. Therefore, it is possible to reduce a size of the ESD protection circuit and thus provide the LCD device 100 having a thinner bezel area. In other words, if a one-hole bridge contact portion is applied, a size of an ESD protection circuit including a thin film transistor containing an oxide semiconductor can be reduced. This size is not to be greater than a size of an ESD protection circuit having equivalent ESD performance and including a thin film transistor containing amorphous-silicon.

Figure 6:
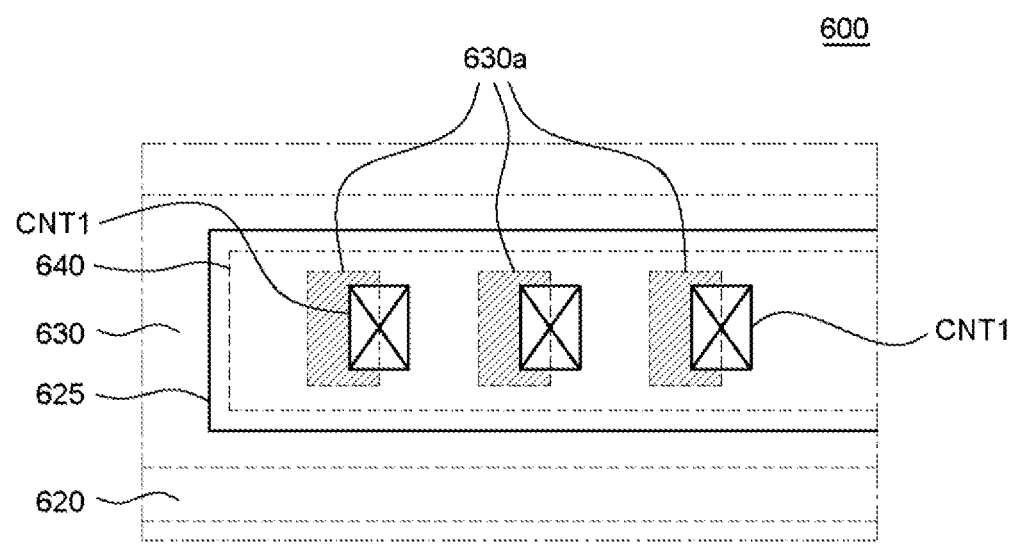
FIG. 6 is a schematic plan view of a LCD device, according to another embodiment of the present disclosure.

FIG. 6 is a schematic plan view of a liquid crystal display (LCD) device, according to another embodiment of the present disclosure. FIG. 6 illustrates a supply voltage line unit disposed in a bezel area of a liquid crystal display (LCD) device 600, and illustrates another embodiment in which the first contact hole 'CNT1' illustrated in FIG. 5 is applied to a supply voltage line unit different from the ESD protection circuit. A cross-sectional view of the first contact hole 'CNT1' applied to the supply voltage line unit is substantially the same as the cross-sectional view of the first contact hole 'CNT1' in FIG. 5, and thus will be omitted herein.

A plurality of gate lines 620 extended to an active area is disposed on the supply voltage line unit. Further, a first metal layer 640 is disposed on the same level as the plurality of gate lines 620. The first metal layer 640 is disposed between the plurality of gate lines 620 to be parallel to the plurality of gate lines 620. The first metal layer 640 may be an additional supply voltage line configured to apply a supply voltage signal to the active area. A gate insulating layer is disposed on the first metal layer 640. A second metal layer 630 on the same level as a source electrode and a drain electrode is disposed on the gate insulating layer. The second metal layer 630 is formed on the same level as the source electrode and the drain electrode to be overlapped with the first metal layer 640 and the gate line 620. The second metal layer 630 transfers a supply voltage signal. In order to transfer the supply voltage signal from the second metal layer 630 to the first metal layer 640, the second metal layer 630 and the first metal layer 640 are connected with each other through the first contact hole 'CNT1'.

The second metal layer 630 includes a plurality of openings 630a. The plurality of openings 630a are configured to expose a part of a top side of the first metal layer 640. Although not illustrated in the drawing, insulating layers such as a passivation layer, a planarization layer, and an upper insulating layer are disposed on the second metal layer 630. The passivation layer, the planarization layer, and the upper insulating layer include an opening configured to expose the top side of the first metal layer 640 and a part of a top side of the second metal layer 630. That is, the first contact hole 'CNT1' has a shape in which the plurality of openings 630a and the opening in the passivation layer, the planarization layer, and the upper insulating layer are combined into one. The top side of the first metal layer 640 is exposed through the openings 630a in the second metal layer 630 and the top side of the second metal layer 630 are electrically connected with each other by a conductive layer 625.

In the LCD device 600, since the first metal layer 640 and the second metal layer 630 are electrically connected with each other through the single first contact hole 'CNT1', a size of the supply voltage line unit may be decreased. Therefore, the LCD device 600 having a thinner bezel can be realized.

Figure 7:
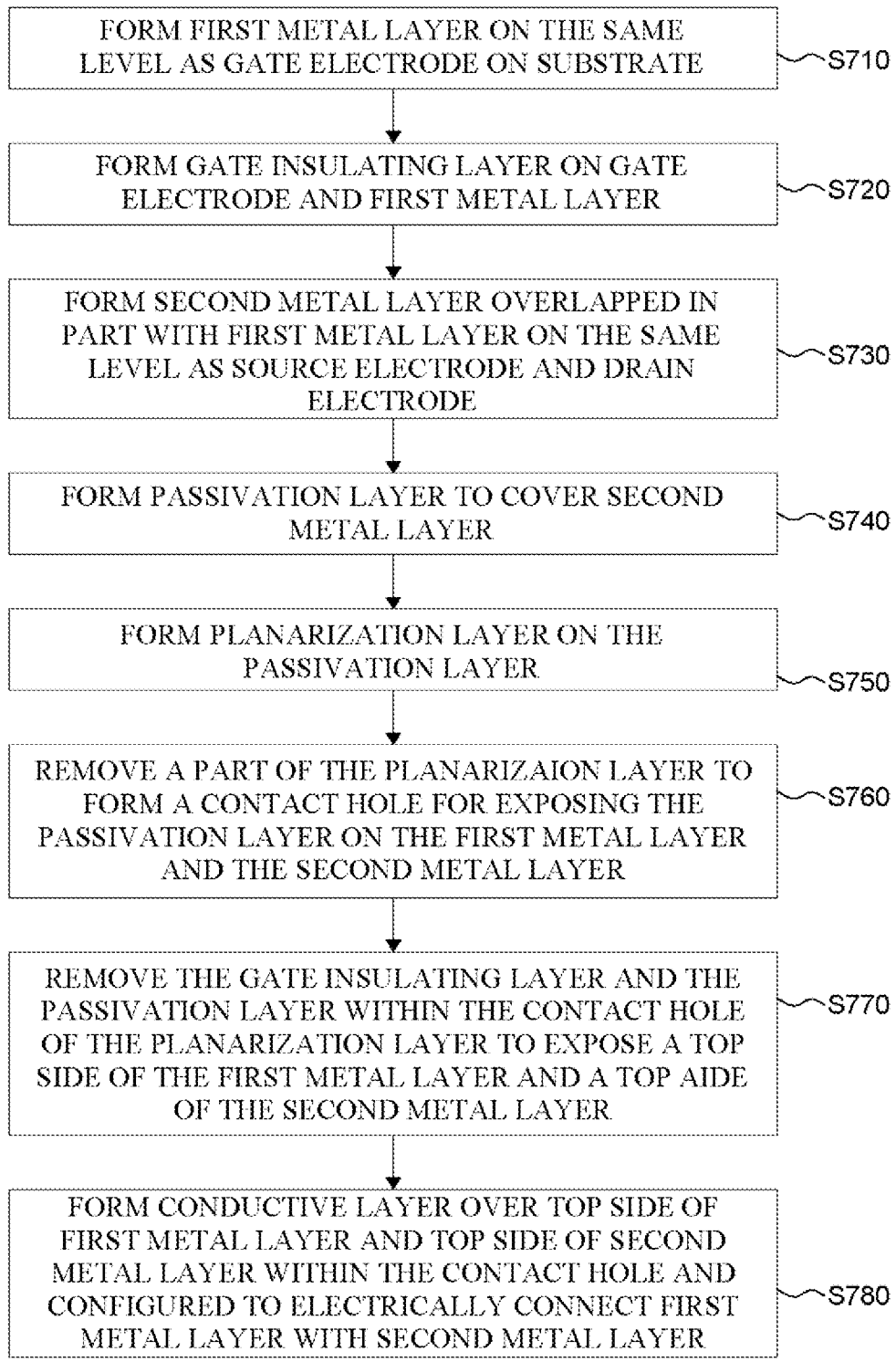
FIG. 7 is a schematic flowchart describing a manufacturing method of a LCD device, according to one embodiment of the present disclosure.

FIG. 7 is a schematic flowchart provided for describing a manufacturing method of a liquid crystal display (LCD) device, according to one embodiment of the present disclosure. FIG. 8a to FIG. 8f are schematic process cross-sectional views provided for describing the manufacturing method of a liquid crystal display (LCD) device, according to one embodiment of the present disclosure.

In the manufacturing method of a liquid crystal display (LCD) device, according to one embodiment of the present disclosure, a plurality of layers is patterned at the same time in order to reduce the number of masks used in the LCD device. According to the manufacturing method of a LCD device in which the plurality of layers is patterned at the same time, the number of contact holes is minimized, so that the LCD device having a reduced bezel area can be realized.

Figure 8A:
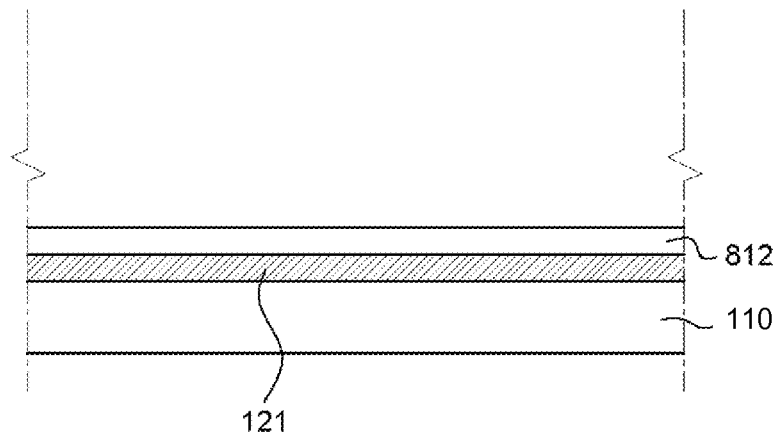
FIGS. 8a to FIG. 8f are schematic process cross-sectional views describing the manufacturing method of a LCD device, according to one embodiment of the present disclosure.

Firstly, a gate electrode and the first metal layer 121 are formed on the same level on the substrate 110. Referring to FIG. 8a, the first metal layer 121 is formed on the substrate 110. Although not illustrated in FIG. 8a, the first metal layer 121 may be patterned. A gate insulating layer 812 is formed on the gate electrode and the first metal layer 121. The un-patterned gate insulating layer 812 is disposed on the entire surface of the substrate 110.

Figure 8B:
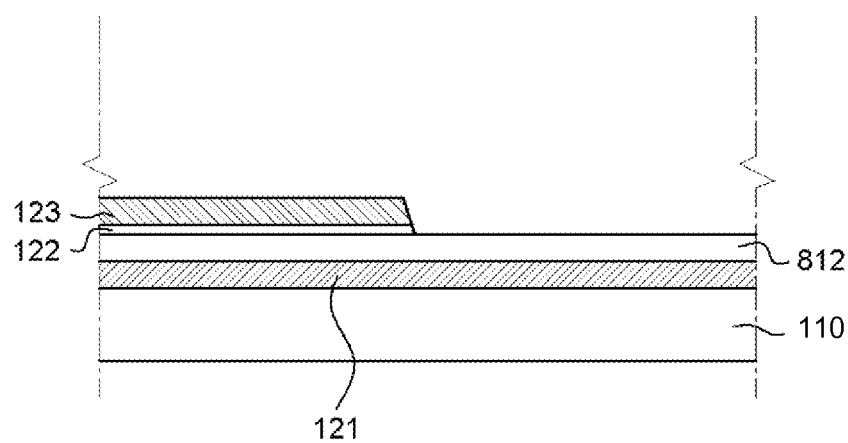

The second metal layer 123 is overlapped in part with the first metal layer 121 and is formed on the same level as a source electrode and a drain electrode. Referring to FIG. 8b, the second metal layer 123 and the active layer 122 are patterned and disposed. The active layer 122 may contain an oxide semiconductor on the gate insulating layer 812 and may be formed before the formation of the second metal layer 123. In one embodiment, the active layer 122 and the second metal layer 123 are deposited in sequence on the entire surface, and a photoresist process may be performed using a half-tone mask in order not to form the second metal layer 123 on the active layer 122 between the source electrode and the drain electrode. According to this process, the number of masks can be reduced, but the active layer 122 is brought into contact with the bottom of the second metal layer 123 as illustrated in FIG. 8b.

The process for forming the active layer 122 is not limited to the process using the half-tone mask, and may use a process using an etch stopper or a process of patterning the active layer 122.

Figure 8C:
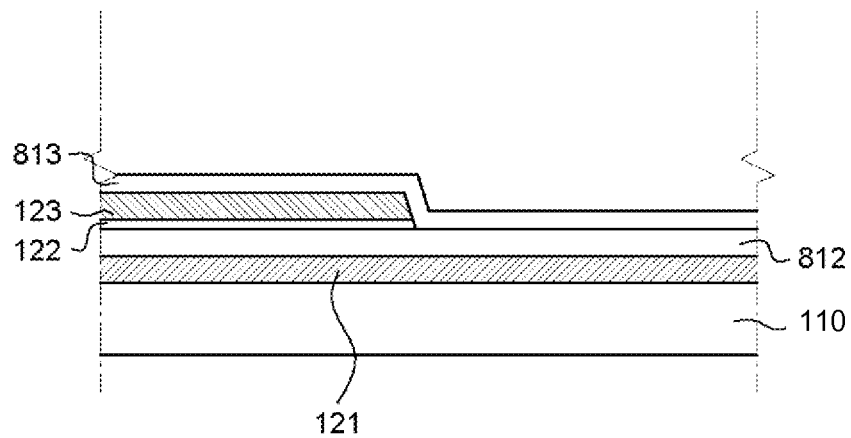

A passivation layer 813 is formed to cover the second metal layer 123. Referring to FIG. 8c, the un-patterned passivation layer 813 is formed on the entire surface of the substrate 110. If the active layer 122 is formed by the process using the half-tone mask, the passivation layer 813 is in direct contact with the active layer 122 between the source electrode and the drain electrode. The planarization layer 114 is formed on the second metal layer 123, and a part of the planarization layer 114 is removed to form a hole exposing the passivation layer 813 on the first metal layer 121 and the second metal layer 123. Further, a common electrode may be disposed on the planarization layer 114, and an upper insulating layer 815 may be disposed on an upper portion of the planarization layer 114 in which a hole is formed to insulate the common electrode from another conductive material, such as a pixel electrode. However, the present disclosure is not limited thereto, and the pixel electrode and the common electrode may be disposed on the same plane or the pixel electrode may be disposed under the common electrode depending on a pixel structure of the LCD device 100.

Figure 8D:
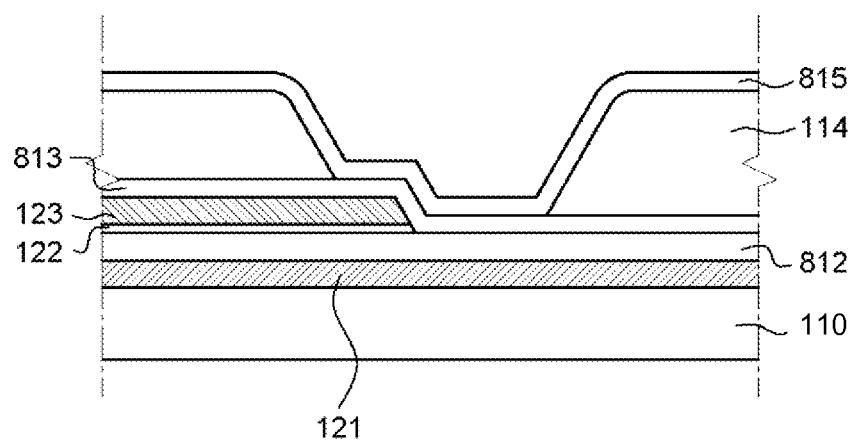

If the upper insulating layer 815 is disposed, the upper insulating layer 815 is disposed on the entire surface of the substrate 110 as illustrated in FIG. 8d. Then, the gate insulating layer 812 and the passivation layer 813 are removed from the hole in the planarization layer 114 to expose the top side of the first metal layer 121 and a part of the top side of the second metal layer 123. Then, the conductive layer 125 disposed over the top side of the first metal layer 121 and the top side of the second metal layer 123 and configured to electrically connect the first metal layer 121 with the second metal layer 123 is formed within the hole in the planarization layer 114.

Referring to FIG. 8d, the gate insulating layer 812, the passivation layer 813, and the upper insulating layer 815 are disposed on the entire surface of the substrate 110. In the manufacturing method of a LCD device according to one embodiment of the present disclosure, the number of masks can be reduced by removing a part of at least two layers of the gate insulating layer 812, the passivation layer 813, and the upper insulating layer 815 at one time.

In particular, if the gate insulating layer 812 is one of the two or more layers removed at one time, an opening of the gate insulating layer 812 for directly connecting the first metal layer 121 with the second metal layer 123 cannot be formed. Therefore, in the manufacturing method of a LCD device in which a plurality of layers is patterned at the same time, the first metal layer 121 and the second metal layer 123 cannot be directly connected with each other. Therefore, the prior art discloses a structure in which an upper part of the first metal layer 121 and an upper part of the second metal layer are exposed through separate holes, respectively. Further, the upper part of the first metal layer 121 and the upper part of the second metal layer 123 are electrically connected with each other by the conductive layer 125. However, each hole has a minimum required size and a margin is needed between the holes. Therefore, if such a structure is disposed in a bezel area, a size of the bezel area is increased.

Figure 8E:
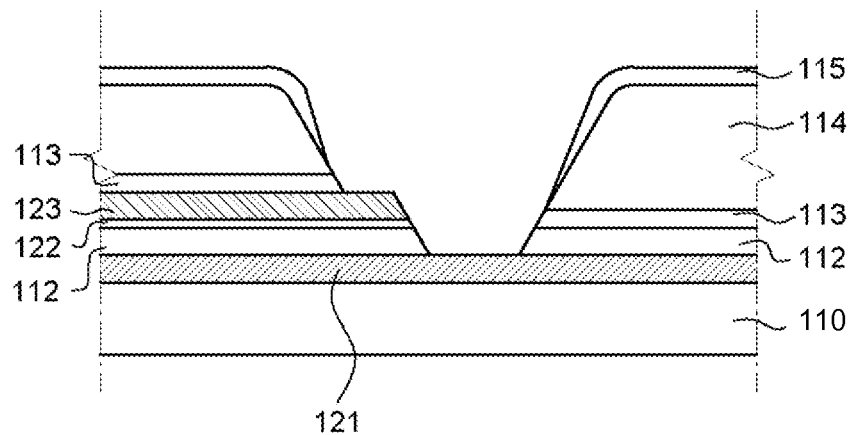
Figure 8F:
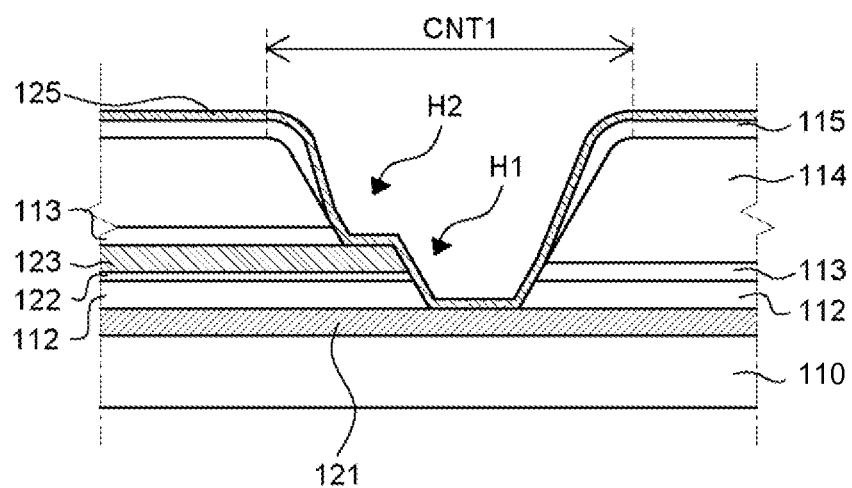

However, referring to FIG. 8e and FIG. 8f, even if the gate insulating layer 112, the passivation layer 113, and the upper insulating layer 115 are removed at one time, since the first metal layer 121 and the second metal layer 123 are disposed to be overlapped with each other, the upper part of the first metal layer 121 and the upper part of the second metal layer 123 can be connected by the conductive layer 125 within the single first contact hole 'CNT1'.

In the manufacturing method of a LCD device, according to one embodiment of the present disclosure, the LCD device is manufactured with a minimized number of masks. Further, the first metal layer 121 and the second metal layer 123 of a LCD device are electrically connected with each other by the conductive layer 125 within a single contact hole in the planarization layer 114. Thus, it is possible to reduce a size of the bezel area by reducing the number of holes in the planarization layer 114 while maintaining the minimized number of masks. That is, the LCD device having a thinner bezel area can be provided by using a minimized number of masks.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the scope of the technical concept of the present disclosure. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a first thin film transistor in a bezel area on a substrate; and
a second thin film transistor adjacent to the first thin film transistor;
each thin film transistor including:
a first metal layer, a first insulating layer, a second metal layer, a second insulating layer, and a third metal layer deposited in sequence on a substrate,
wherein the first insulating layer and the second insulating layer include a one-hole bridge contact portion exposing a part of the first metal layer and a part of the second metal layer in one hole,
wherein the third metal layer is in contact with the first metal layer and the second metal layer through the one-hole bridge contact portion, and
wherein the first thin film transistor and the second thin film transistor are configured to share the first metal layer.

2. The display device according to claim 1,
wherein the first metal layer and the second metal layer are electrically connected through one of a first contact hole of the first insulating layer and a second contact hole of the second insulating layer, and
wherein the one-hole bridge contact portion is a structure that reduces an increase in number of masks for forming the first contact hole of the first insulating layer or the second insulating layer and reduces an increase in design area caused by the first and second contact holes.

3. The display device according to claim 2, wherein the one-hole bridge contact portion is applied to an electrostatic discharge protection circuit, the electrostatic discharge protection circuit including a thin film transistor containing an oxide semiconductor in a bezel area of the display device.

4. The display device according to claim 3, wherein by applying the structure of the one-hole bridge contact portion, a size of the electrostatic discharge protection circuit is realized not to be greater than a size of an electrostatic discharge protection circuit having equivalent electrostatic discharge performance and including a thin film transistor containing amorphous-silicon.

5. A liquid crystal display device comprising:
a substrate including:
an active area; and
a bezel area including a thin film transistor and surrounding the active area;
a first metal layer in the bezel area on the substrate;
a first insulating layer on the first metal layer, the first insulating layer including a first opening exposing a part of a top side of the first metal layer;
a second metal layer overlapping the first metal layer;
a second insulating layer on the second metal layer, the second insulating layer including a second opening exposing the part of the top side of the first metal layer and a part of a top side of the second metal layer; and
a conductive layer in contact with the part of the top side of the first metal layer and the part of the top side of the second metal layer within the second opening in the second insulating layer,
wherein the thin film transistor including an active layer containing an oxide semiconductor, a gate electrode, a source electrode and a drain electrode, wherein the first metal layer is on a same level as the gate electrode, the second metal layer is on a same level as the source electrode and the drain electrode, and the second insulating layer is a planarization layer configured to flatten an upper part of the thin film transistor, and
wherein the first metal layer is extended from the gate electrode and the second metal layer is extended from one of the source electrode and the drain electrode.

6. The liquid crystal display device according to claim 5, further comprising:
an electrostatic discharge protection circuit in the bezel area,
wherein the electrostatic discharge protection circuit includes the thin film transistor.

7. The liquid crystal display device according to claim 6, further comprising:
a first line on a same level as the second metal layer;
a second line on a same level as the second metal layer and at least in part parallel to the first line; and
a third line on the same level as the first metal layer and intersecting with the first line and the second line,
wherein the electrostatic discharge protection circuit is between the first line and the second line, and wherein the thin film transistor is at a portion where the first line and the second line intersect with the third line.

8. The liquid crystal display device according to claim 7, wherein the first metal layer is connected with the gate electrode and the third line, and
wherein the second metal layer is connected with one of the source electrode and the drain electrode.

9. The liquid crystal display device according to claim 5, further comprising:
a driving thin film transistor in the active area, the driving thin film transistor configured to drive a pixel, and including an active layer containing an oxide semiconductor,
wherein a channel length of the active layer in the thin film transistor is longer than a channel length of the active layer in the driving thin film transistor.

10. The liquid crystal display device according to claim 5, further comprising:
a supply voltage line unit in the bezel area,
wherein the supply voltage line unit includes the first metal layer, the second metal layer, and the conductive layer.

11. The liquid crystal display device according to claim 5, wherein the active layer of the thin film transistor is in contact with a bottom side of the second metal layer.

12. The liquid crystal display device according to claim 11, wherein the conductive layer is in contact with a lateral side of the active layer.

13. The liquid crystal display device according to claim 11, wherein the conductive layer is in contact with the first metal layer, the gate insulating layer, the active layer, and the second metal layer within the first opening and the second opening.

14. The liquid crystal display device according to claim 5, further comprising:
a passivation layer on the source electrode and the drain electrode,
wherein the passivation layer is in contact with the active layer between the source electrode and the drain electrode.

15. A display device comprising:
a substrate having a display area in a pixel array and a bezel area around the display area; and
an electrostatic discharge (ESD) protection circuit on the bezel area, the ESD protection circuit configured to protect the pixel array from electrostatic discharges, the ESD protection circuit comprising a plurality of thin film transistors (TFTs), each TFT having an oxide semiconductor material as its active layer, and
a bridge electrode connected to a gate electrode of a first TFT and a source/drain electrode of a second TFT adjacent to the first TFT via a contact hole,
wherein the first TFT and the second TFT adjacent to the first TFT are configured to share the gate electrode.

16. The display device according to claim 15, where each TFT comprises a gate electrode, a first insulating layer, the active layer, a source/drain electrode, and a second insulating layer.

17. The display device according to claim 15, where the bridge electrode is configured to be connected to a top surface of the gate electrode, an one aspect of the active layer, and to the source/drain electrode.

18. The display device according to claim 15, where the contact hole is configured to have a different width according to a position of the contact hole.

19. The display device according to claim 15, further comprising:
a Vcom voltage transition line extending over the gate electrode, the Vcom voltage transition line positioned on a same plane as the gate electrode.

20. The display device according to claim 19, further comprising:
a data voltage transition line extending over the source/drain electrode, the data voltage transition line positioned on a same plane as the source/drain electrode.

21. The display device according to claim 20, wherein the Vcom voltage transition line and the data voltage transition line intersect each other.

22. The display device according to claim 21, where the Vcom voltage transition line and the data voltage transition line intersect at a part of the first TFT and the second TFT.

* * * * *